United States Patent [19]

Takahashi et al.

[11] Patent Number: 5,204,805
[45] Date of Patent: Apr. 20, 1993

[54] CASING ASSEMBLY FOR ELECTRONIC EQUIPMENT

[75] Inventors: Tatsuhiko Takahashi; Masaaki Taguchi; Minoru Murayama; Fumio Watanabe, all of Tokyo, Japan

[73] Assignee: Yokogawa Electric Corporation, Tokyo, Japan

[21] Appl. No.: 921,427

[22] Filed: Jul. 31, 1992

[30] Foreign Application Priority Data

Sep. 10, 1990 [JP] Japan .................................. 2-239429

[51] Int. Cl.$^5$ ............................................ H05K 7/20
[52] U.S. Cl. ...................................... 361/386; 211/41;
361/413; 361/419; 439/76; 455/348
[58] Field of Search ................. 165/80.3, 185; 357/81;
211/41, 94; 439/76, 78, 485; 455/346–348, 90,
128; 361/380, 391, 386–389, 393–396, 399, 412,
413, 415, 417, 419, 420, 426, 429

[56] References Cited

U.S. PATENT DOCUMENTS

| | | | |
|---|---|---|---|
| 4,516,189 | 5/1985 | Seaks, Jr. | 361/426 |
| 4,700,846 | 10/1987 | Schroder | 211/41 |
| 4,788,621 | 11/1988 | Russell | 361/115 |
| 4,791,527 | 12/1988 | Brown | 361/424 |
| 4,965,699 | 10/1990 | Jordan | 361/387 |
| 4,974,119 | 11/1990 | Martin | 361/386 |
| 5,043,847 | 8/1991 | Deinhardt | 361/395 |
| 5,046,172 | 9/1991 | Moreaux | 361/332 |
| 5,057,971 | 10/1991 | Hautvast | 361/396 |

Primary Examiner—Gerald P. Tolin
Attorney, Agent, or Firm—Moonray Kojima

[57] ABSTRACT

A casing assembly for electronic equipment comprising a printed circuit board on which an exothermic electronic component is mounted, a casing for covering the printed board, and a base for attaching the casing to a wall body or a rail. The base is of a high heat conductive material and has a planar structure which results in a large contact area between it and the wall body or rail. A high heat conductive plate like cushioning member made of an electrically insulative material is interposed between the board and the base in contact therewith. The heat generated in the electronic component is released through the printed board and lead wires and through the cushioning member and the base to the wall body or rail. Preferably, where the casing is attached to the rail, a guide latch member and a pressure latch member are attached to the base. Where an auxiliary printed board is provided in addition to the printed board, the base, the printed board, the auxiliary frame and the auxiliary printed board are stacked in that order and covered with the casing. Where a programmer is attached to the casing, provision is made for attaching in either the horizontal or vertical direction. Where the functions of a basic module is insufficient, extended modules may be connected.

6 Claims, 11 Drawing Sheets

Fig.11 (A)
Fig.11 (B)
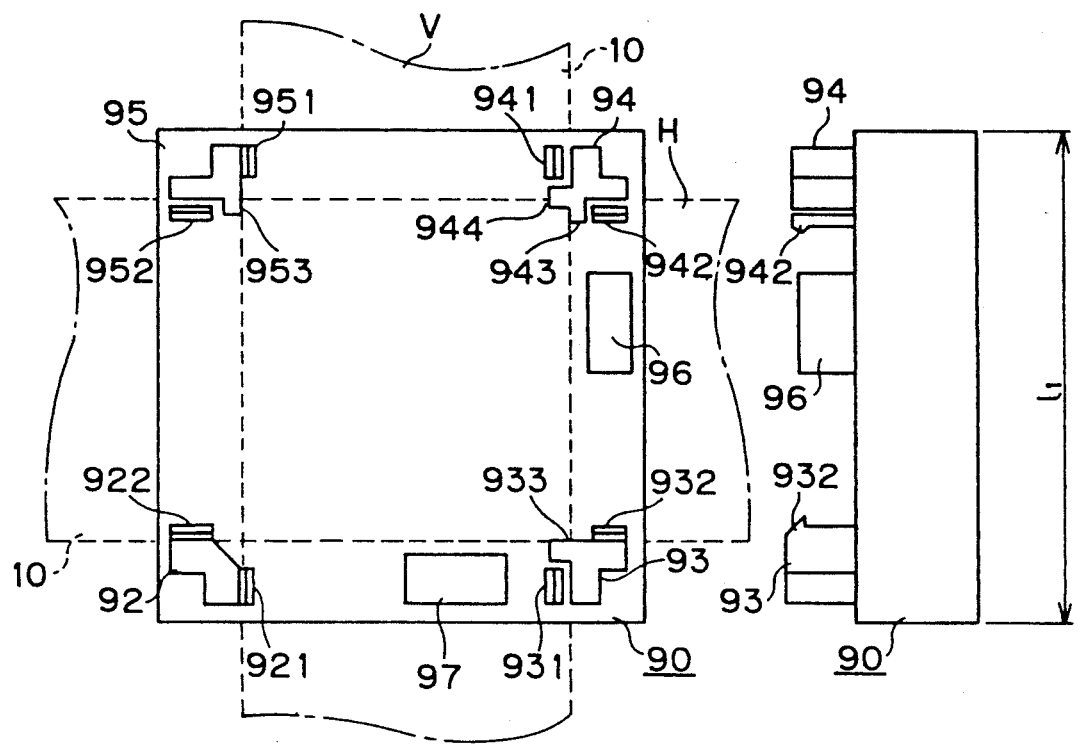
Fig.12
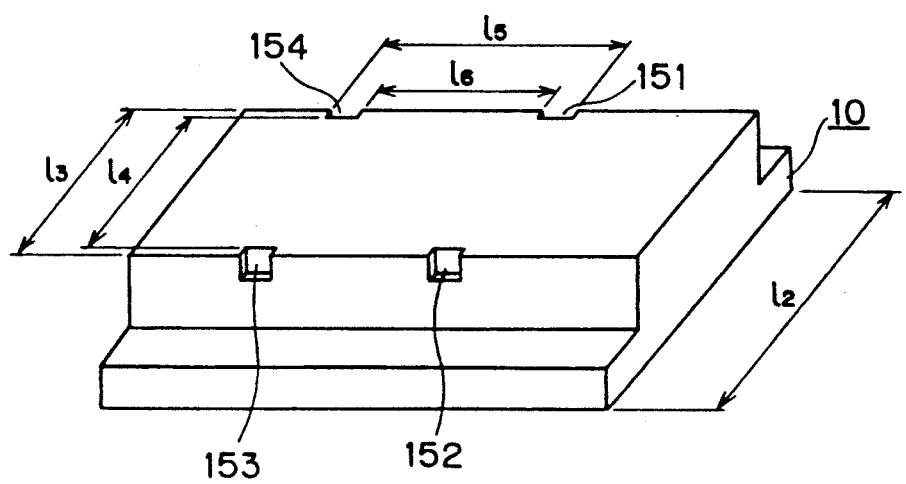

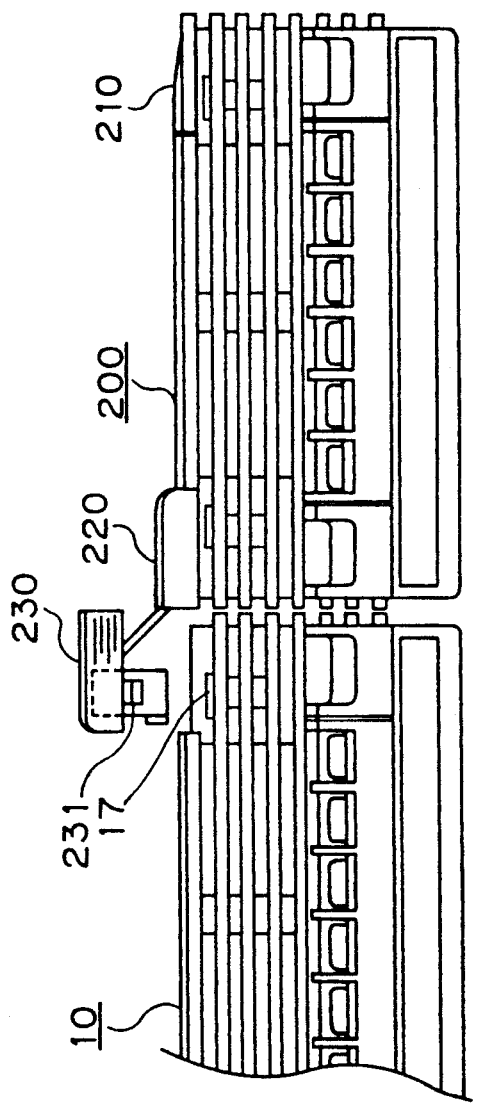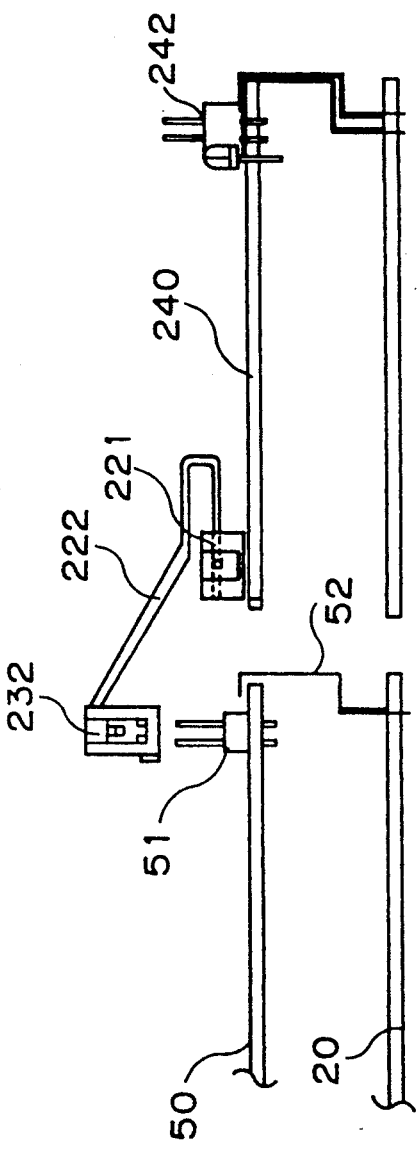

CASING ASSEMBLY FOR ELECTRONIC EQUIPMENT

BACKGROUND OF THE INVENTION

1. Field of The invention

This invention relates to a casing assembly for electronic equipment, which is used to accommodate instruments, and the like, of the rack mount type; and, more particularly, to a structural improvement of the casing assembly.

2. Description of the Prior Art

Electronic equipment includes, for example, control devices as mounted in machine tools, control panels, etc. Since the casing assembly for such control devices is generally mounted internally, it is desirable that the size thereof be small. One example of a casing assembly is disclosed in Japanese Laid-Open Patent 1-200,699.

To decrease the size of the casing assembly, the following factors must be considered.

(i) Mounting of DIN rail

A casing assembly for electronic equipment is generally attached to a DIN (Deutsche Industrie Norm) rail or a wall body. In this regard, the casing assembly must have a mechanism for attaching the assembly to the DIN rail. This attaching mechanism, however, increases the overall size of the casing assembly, or becomes unnecessary when the casing assembly is attached to a wall body.

(ii) Heat release

Since electronic equipment includes an exothermic element, such as a power source, it is necessary to suppress the internal temperature to below a given level by releasing the heat. To attain heat release, conventional electronic equipment utilizes radiation and convection, but, not conduction. In the case of radiation and convection associated with the surface of the casing assembly, the amount of heat to be released is determined by the temperature difference and the surface area of the casing assembly. On the other hand, in the case of convection associated with the heated air inside the casing assembly which is made up of free convection and forced convection, the amount of heat to be released is determined by the opening area of the casing assembly which is available for free convection or by the size and number of fans, and the like, used for forced convection.

If the electronic components are densely packed into a smaller sized casing assembly without improving the heat releasing mechanism, the internal temperature will rise, since the power of heat release will decrease with decrease in size, for the same heating value. Thus, the range of surrounding temperatures in which the casing assembly is serviceable is narrowed. On the other hand, if the size of the casing assembly is selected so that a given cooling power is obtained, this limits the size reduction of the casing assembly.

(iii) Supporting of terminal mount and printed board

Conventional printed circuit boards are large in size and poor in rigidity, and are supported at both edges by guide grooves of the casing assembly, and screwed at a central portion. Since the rigidity of the printed board increases relatively as the size decreases, it is desirable to eliminate reinforcing members to thereby decrease the number of such parts.

Where two printed circuit boards are stacked, one printed board is screwed usually to the other. In this case, since some electronic components cannot be positioned at such screwed portion, the packaging density decreases, and the assemblying or screwing then presents a problem.

(iv) Mounting of programmer

The control device used in conjunction with an input device is called a "programmer". Depending on the direction the control device is extended, such as lateral or longitudinal, the programmer is attached to the control device in the lateral or longitudinal direction. The display direction of a display section, which comprises an LCD, or the like, provided in the programmer coincides with the mounting direction of the programmer relative to the control device. Generally, it is desirable or convenient for the user, if the display section of the programmer is easy to observe irrespective of the direction of mounting of the control device.

(v) Cover and Connection

A connector is mounted on the control device and is used to connect the programmer. Since the programmer is not always connected, it is usually covered with a protective covering to guard the contact element when not in use. If the protective covering is detachable, it is liable to become lost. On the other hand, if the covering is slidable or pivotable, it needs a dead space in which to move. Thus, the packaging space inside the control device is decreased, and the surface of the casing assembly loses its smooth appearance.

When the programmer is mounted together with the control device, it is connected to a connector via a latch provided on the programmer. This latch serves as a guide and retainer in relation to the connector. However, if a force is applied to the programmer, it is applied through the latch to the connector. Thus, reliability of the connection to the connector is degraded.

(vi) Attachinq of an extended module

An extended module is connected to a casing where additional functions are desired, in addition to the standard functions of a basic module of the casing assembly. In that case, it is desirable that the casing be uniform and a joint cable be placed inside the casing so as to not be visible from the outside. Since the connection of the extended module is made to only one casing, it is better to simplify the connection mechanism, for connecting the extended module, of the casing assembly.

SUMMARY OF THE INVENTION

A first object of the invention is to provide a small sized casing assembly for electronic equipment which attaches to a DIN rail.

A second object is to provide a casing assembly for electronic equipment, whose cooling ability to suppress internal temperature increases, is enhanced so that electronic equipment can operate at higher surrounding temperatures.

A third object is to provide a casing assembly for electronic equipment, whose heat releasing effect is enhanced so that components can be more densely packed therein and so that the size thereof is decreased substantially for the same heat release as in the prior art devices.

A fourth object is to provide a casing assembly for electronic equipment whose parts are reduced, and which can be assembled by stacking in one direction, and which can be easily assembled.

A fifth object is to provide a casing assembly for electronic equipment whose degree of freedom related to attaching direction of the programmer is enhanced, and whose parts can be preventing from being lost, and can be readily changed, and whose handing is readily facilitated.

A sixth object is to provide a small-sized casing assembly for a basic module to which an extended module can be attached with high reliability.

The first object is attained by the invention, comprising a printed circuit board on which an exothermic electronic component is mounted, a casing for covering the printed board, and a base for attaching the casing to a wall body or DIN rail having a substantially U-shaped cross section and two flanges. Included is a guide latch member detachably mounted to the base which is engaged with one flange of the rail, and a pressure latch member detachably mounted to the base which is engaged with the other flange of the rail, and has a slider which resiliently contacts the rail. Thus, where the casing eassembly is to be attached to the DIN rail, the guide latch member and the pressure latch member are mounted on the base. Where the casing assembly is to be attached to the wall body, neither the guide latch member nor the paressure latch member is mounted on the base. Thus, in the emodiment, the overall size of the casing assembly is substantially reduced.

The second and third objects are attained by the invention, wherein the base is made of a high heat conductive material and has a planar structure with a large contact area between the base and the wall body or DIN rail, and a high heat conductive, flexible plate-like cushioning member of an electrically, insulative material, is interposed between the printed board and the base and in contact therewith. The thickness of the cushioning member is larger than the length of the lead wires of the electronic component that projects from the printed board. Thus, the heat generated in the electronic component is released through the printed board and the lead wires and through the cushioning member and the base to the wall body or rail. Since the cushioning member is interposed between the printed board and the base, it conducts the heat from the exothermic electronic component mounted on the printed board to the base. Since the heat is conducted from the base to the rail or wall body, the casing assembly is efficiently cooled, and no thermal problems arise even when the components are densely packed on the printed board.

The fourth object is attained by the invention, wherein an auxiliary printed circuit board is interposed between the main printed board and a flat face of the casing, and an auxiliary frame, which is held integrally with the auxiliary printed board, is attached to the main printed board. Specifically, the base, the main printed board, the auxiliary frame and the auxiliary printed board are stacked in that order and covered with the casing. Thus, since the auxiliary printed board is positioned above the main printed board, the packing area is increased without any appreciable increase in size of the casing assembly because of the double stacked structure. Since the auxiliary frame is first made integral with the auxiliary printed board, and then the combined structure is attached to the main printed board, assemblying is facilitated.

The fifth object is attained by the invention comprising a printed circuit board, a casing for covering the printed board, and a programmer attached to the casing and connected to the printed board. The programmer is substantially square in two dimensions and has four attaching legs provided at substantially the four vertices thereof and latches provided on the inner side faces of the attaching legs, and the casing has four recesses formed in the upper face thereof corresponding to the four attaching legs. Thus, the programmer can be attached to the casing from a horizontal direction or from a vertical direction. The programmer is used to set, confirm and read the operating conditions of, for example, a central processing unit, or the like, mounted on the printed board. Since the four attaching legs are provided at the vertices of the square, the programmer can be attached to the casing from either of the two horizontal or vertical directions by appropriate use of the recesses of the casing.

The sixth object is attained by the invention wherein a basic module comprises a main connector at a dented position below the surface of its casing and a connector cover for covering the main connector, and is detachably attached on a face which is in alignment with the surface of the casing; and wherein an extended molule comprises a fixed-side cable cover attached on a face which is in alignment with the surface of its extended side casing, to which one end of a flat cable is attached, a joint connector connected to the main connector, to which the other end of the flat cable is attached and a movable side cable cover which is mounted to the casing of the basic module in place of the connector cover where the joint connector is connected. Where the extended module is connected to the basic module, the connector cover is removed, and the movable side cable cover is mounted, and the main connector is connected to the joint connector. To increase reliability, the connection of the basic module with the main connector, the extended module has the movable cable cover, and the flat cable is attached to the extended module via the fixed side cable cover. The connectors are thus readily connected to the arrangement with resulting high reliability.

BRIEF DESCRIPTION OF THE DRAWINGS.

FIGS. 11(A) and 11(B) are views depicting the programmer.

FIG. 12 is a perspective view depicting the casing on which the programmer is mounted.

FIGS. 16(A) and 16(B) are fragmentary side views depicting the casing and extended module after connection.

DESCRIPTION OF THE PREFERRED EMBODIMENTS

Figure 1:
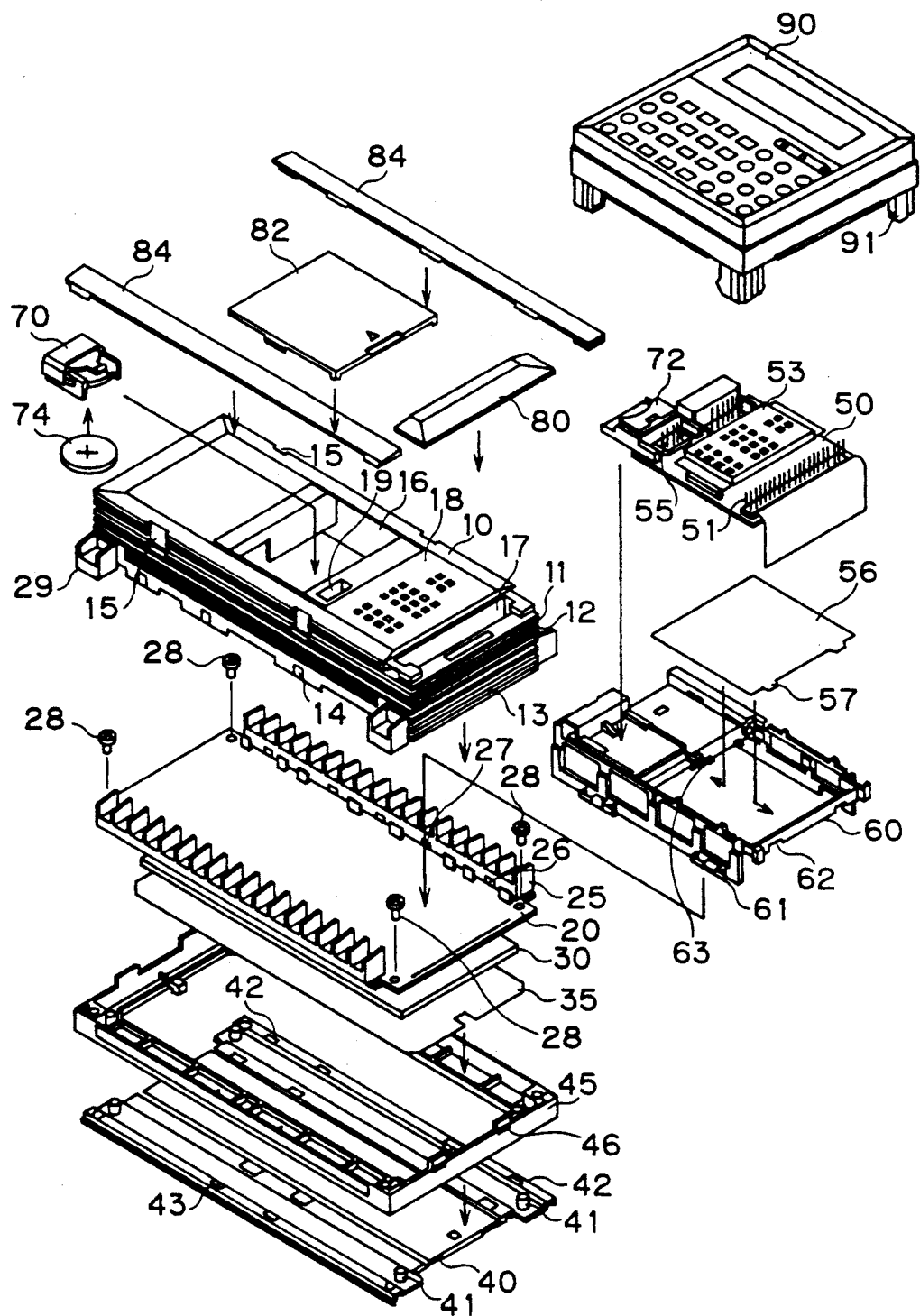
FIG. 1 is an exploded perspective view depicting an illustrative embodiment of the invention.

In FIG. 1, a casing 10 has ventilating openings 11 formed in the different side faces thereof, except for a side face to be attached to a wall body, which are defined by ribs 12. Each ventilating opening 11 is of such size that foreign matters, such as screws, cannot enter the casing through the opening, yet, free convection is not impeded thereby. Ribs 12 are provided in , for example, lattice form. An engaging portion 13, in the form of a recess or opening, is provided along a lower short edge of casing 10, with which a pawl portion 46, provided on a frame 45, is engaged. An engaging portion 14, in the form of a recess or opening, is provided along a lower long edge of casing 10, with which pawl portion 27, provided on a terminal mount 25, is engaged.

A recess 15 is formed along an upper long edge of casing 10, which is used to mount a programmer 90. An opening 16 is formed at substantially the center of the upper face of casing 10, which facilitates change of battery 74 and the mounting of a ROM pack, not shown. A connector hole 17 is formed along an edge of the upper face of casing 10, in which a main connector 51, for connection with programmer 90 or a checker , is disposed. A display cover 18 is used to cover a display light section 53, whose several portions, in alignment, with light emitting elements, are made in the form of translucent windows A connector hole 19 is formed between opening 16 and display cover 18, in which a sub-connector 55 is disposed. Cover hold mounts 29 are provided at four corners of casing 10, to which a pair of terminal mount covers 84, for covering terminal mount 25, are attached.

A printed circuit board 20 has a heat emitting (i.e. exothermic) electronic component 21, such as power resistors, and a passive component, such as capacitors, mounted thereon. Terminal mount 25 is mounted to a long edge of printed board 20, whose terminals are connected to signal lines, not shown. Terminal mount 25 has convex fixing portions 26, for attaching of an auxiliary prined circuit board 50, and pawl portions 27 for coupling with casing 10. Cover hold mounts 29 are disposed in alignment with the ends of each terminal mount 25.

A cushioning member 30 is attached in contact with board 20, and is made of high heat conductive, electrically insulative, and flexible material. For example, such materials may be rubber, gel, potting or cushioning plastic, and the like, to which preferably silica, or the like, is added to improve heat conductivity. The thickness of cushioning member 20 is made larger than the height of the lead wires and solder attached to board 20, and of the components packed therearound, to ensure electrical insulation. An insulating member 35, which is of rigid rubber, or the like in the form of a plate, is interposed between cushioning member 20 and a base 40. The heat conductivity of insulating member 35 is the same as that of cushioning member 30. Insulating member 30 prevents short circuiting of terminals of printed board 20 that may result because of the cushioning member 30 being flexible.

Base 40, in contact with cushioning member 35, is used to attach casing 10 to a wall body. Base 40 is made of high heat conductive material, such as aluminum or copper, whose rigidity is sufficient to enable attachment of the casing to the wall body. Studs 41 are provided at four corners of base 40, and are used to secure board 20 to base 40 with cushioning member 30 and insulating member 35 interposed therebetween by use of screws 28. Two pairs of attaching holes 42 are formed along one long edge of base 40 and are used to secure DIN rail coupling mechanisms, not shown. A pair of attaching holes 43 are formed along the other long edge of base 40 and are used to secure one DIN rail coupling mechanism, not shown. A frame 45 is quadrangular in shape and when attached to base 40 leaves a certain clearance between base 40 and board 20. The two pawl portions 46, provided along each short edge of frame 45, are resiliently engaged with engaging portions 13 of casing 10.

Auxiliary printed circuit board 50 has, for example, signal processing circuits mounted thereon, such components being, for example, unsuited for mounting on board 20 from the perspective of noise, dust, costs, etc. From the standpoint of wiring, for example, auxiliary board 50 is made of four layered structure. Also, board 20 is made so that both sides thereof are used. Auxiliary board 50 is equipped with a sub-connector 55, as well as main connector 51, for connection with programmer 90, and is provided with display light section 53, for example, of LCDs. A shield plate 56 is attached to an auxiliary frame 60 to ensure electrical and magnetic insulation between auxiliary board 50 and board 20, and is substantially square in shape, and has protrusions 57 formed along one edge thereof.

Auxiliary frame 60 is used to support auxiliary board 50 on board 20, and has notches 62 , fittable with protrusions 57, and a protrusion 63 for receiving the other edge of shield plate 56 opposite of protrusions 57. When attaching auxiliary frame 60 to board 20, a latch 61 is engaged with fixing portion 26 of terminal mount 25.

A holder 70 is inserted through opening 16, and is coupled with a battery storage portion 72, provided on auxiliary board 50, to hold a disc shaped battery 74. A connector cover 80 is provided to close opening 17. A cover 82 is provided to close opening 16 and connector hole 19. Terminal mount covers 84 are attached to cover hold mount 29 to cover terminal mount 25, so that dust is prevented from entering casing 10.

Programmer 90 is mounted on casing 10 and is controlled to write data into electronic circuits provided in printed board 20 and auxiliary printed board 50 or to confirm programs, and can be detachably mounted via latches 91, provided at the four corners thereof, detachably engaged with recesses 15 of casing 10.

The functions of the embodiment will next be described with reference to the following figures of the drawing.

Attaching to DIN rail

Figure 2:
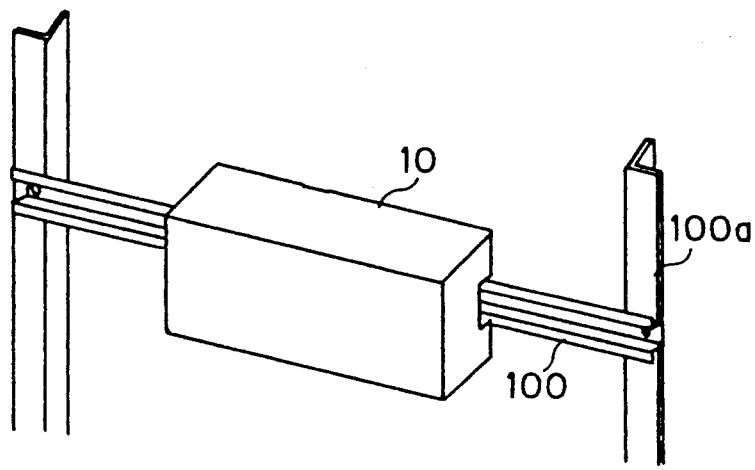
FIG. 2 is a view depicting casing 10 attached to a DIN rail.
Figure 3:
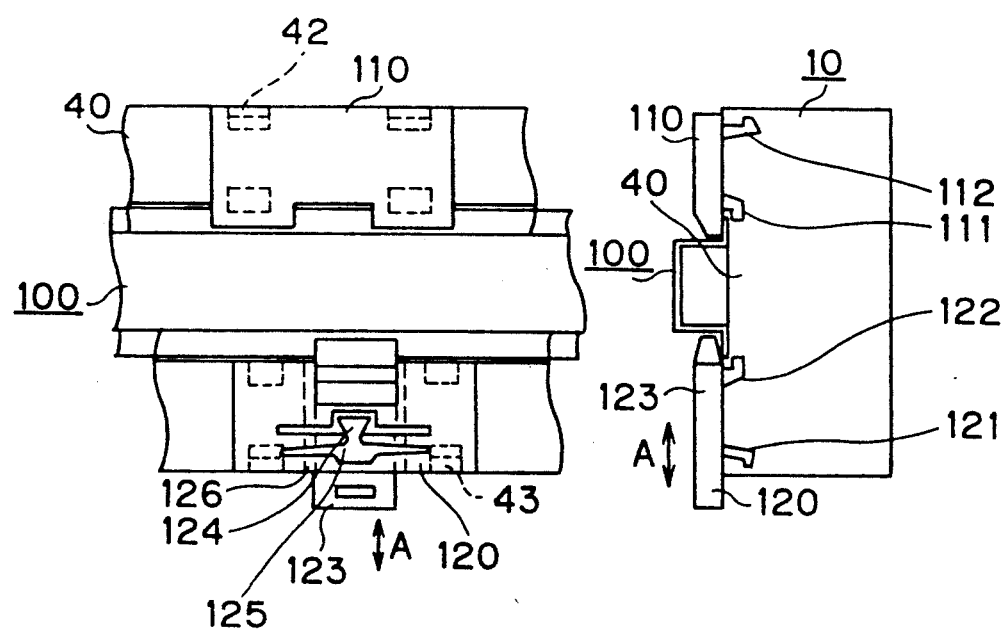
FIGS. 3(A) and 3(B) are fragmentary views depicting a coupling section between the casing and the DIN rail.

FIG. 2 shows casing 10 attached to DIN rail 100, which serves also as a beam for column 100a. FIGS. 3(A) and 3(B) show the procedure for attaching casing 10 to rail 100, wherein FIG. 3(A) is a bottom view and FIG. 3(B) is a side view. DIN rail 100 is a standard rail used to attach electronic equipment to a structure, and is U-shaped in cross section and has a flange at each edge. A guide latch member 110 is secured to base 40 by fitting a hook protrusion 111 and a resilient pawl portion 112 through attaching hole 42 of base 40. A pressure latch member 120 is secured to base 40 by fitting a hook protrusion 121 and a resilient pawl portion 122 through attaching hole 43 of base 40. A secured state is attained by pressing a slider 123 against rail 100. Slder 123 has a convex grip portion 124 at a central portion thereof and is given a restoring force in the direction of arrow A by a cantilever spring portion 125 such that it is slidable along groove 126.

Casing 10 is detached by sliding slider 123 in opposition to spring portion 125 so that slider 123 is disengaged from rail 100. When slider 123 is positioned midway between its sliding limits, slider 123 is not in contact with rail 100, and the casing 10 is moved along rail 100. If no force is applied against slider 123, it is pressed against rail 100 by spring portion 125 and a fixed or attached state results.

When casing 10 is to be attached to a wall body instead of to rail 100, guide latch member 110 and pressure latch member 120 are removed from base 40, and casing 10 is screwed to the wall body. Since casing 10 is designed so that guide latch member 110 and pressure latch member 120 can be attached to the back side of base 40, no appreciable difference in external size arises between the two cases of attaching casing 10 to a wall body or to rail 100. Thus, the arrangement is substantially reduced in size.

Heat Releasing

Figure 4:
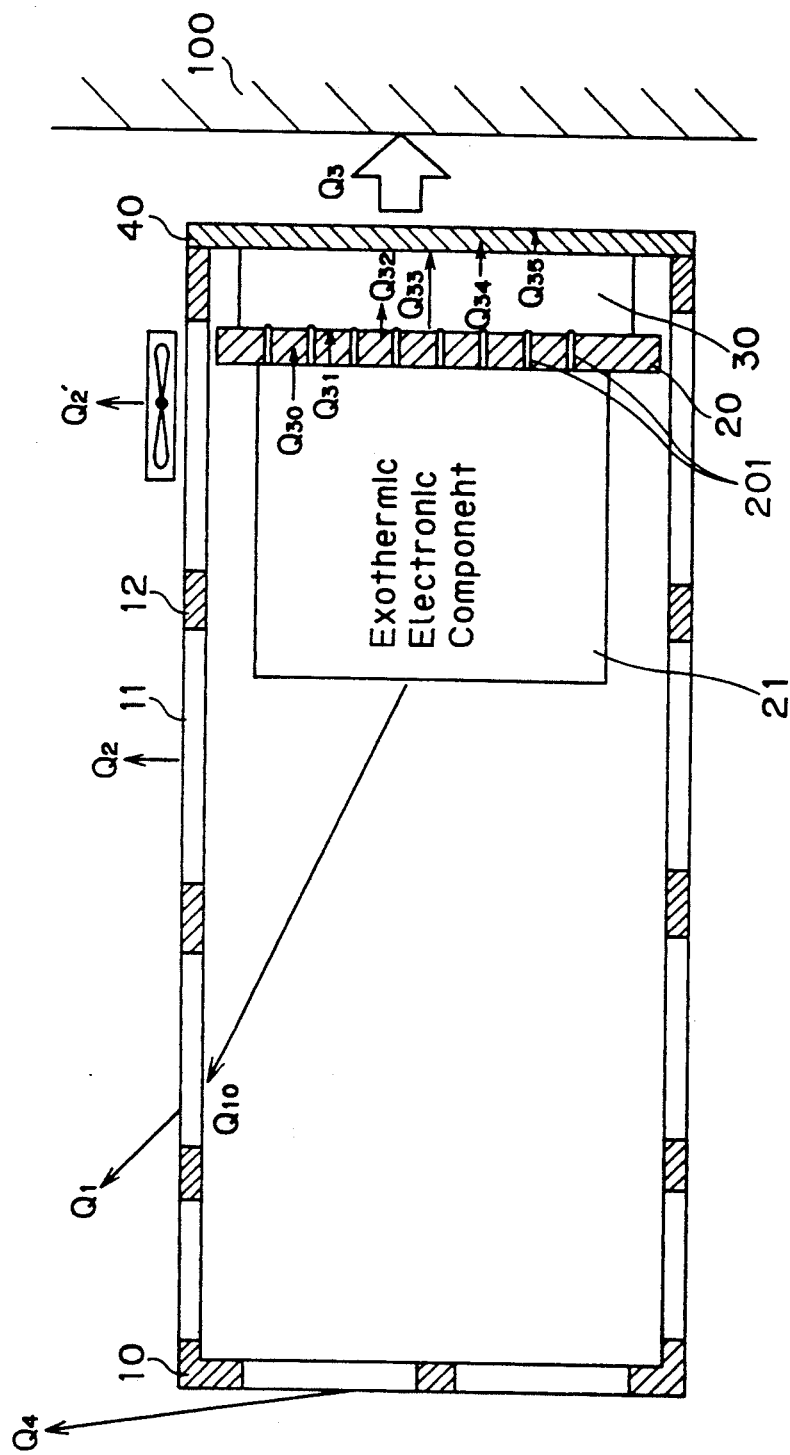
FIG. 4 is a view for explaining the heat releasing mechanism of the casing.

FIG. 4 shows the heat releasing mechanism of casing 10. Board 20 has an exothermic electronic component 21, such as a power transistor, mounted thereon. Heat generated in component 21 is released through radiation, convection and conduction. In the case of radiation, heat from component 21 is transferred to casing 10 (shown as Q10) and then radiated from the surface of casing 10 as infrared rays (Q1). Since radiation contributes very little, the amount of radiation is generally neglected in the design of heat releasing mechanism. In the case of convection, there are heat release (Q2) resulting from free convection around the ventilating openings 12, and heat release (Q2') resulting from forced convection caused by use of a fan.

In the case of conduction, heat from component 21 escapes to the wall body 100, which is inclusive of the DIN rail and the column, to which casing 10 is attached Q30-Q35 and Q3 indicate heat escape by conduction. Specifically, heat conduction Q30 is effected by, for example, lead wires from the component 21 to board 20. Heat conduction Q31 is from one side to the other of board 20. Heat conduction Q32 is from the printed board 20 to cushioning member 30. Heat conduction Q33 is from one side to the other side of cushioning member 30. Heat conduction Q34 is from cushioning member 30 to base 40. Heat conduction Q35 is from one side to the other side of base 40. Heat conduction Q3 is from base 40 to wall body 100. It should be noted that the structure of wall body 100 is made to act also as a heat radiator.

Heat is transferred through the lead wires 201 of board 20 and/or component 21 to cushioning member 30. Good heat conduction to base 40 can be attained by making both cushioning member 30 and insulating member 35 high in heat conductivity. Since base 40 is held in contact with the DIN rail as shown in FIG. 2, heat is quickly conducted to rail 100. Since cushioning member 30 and insulating member 35 are interposed between board 20 and base 40 with adequate pressure, any space of low heat conductivity, such as an air layer, is virtually absent therefrom.

Thus, since the structure of DIN rail, 100, which is comparatively larger in size than casing 10, is utilized as a heat radiating member, the rise of internal temperature can be suppressed even when the heating value of the components 21 on board 20 is large.

Figure 5:
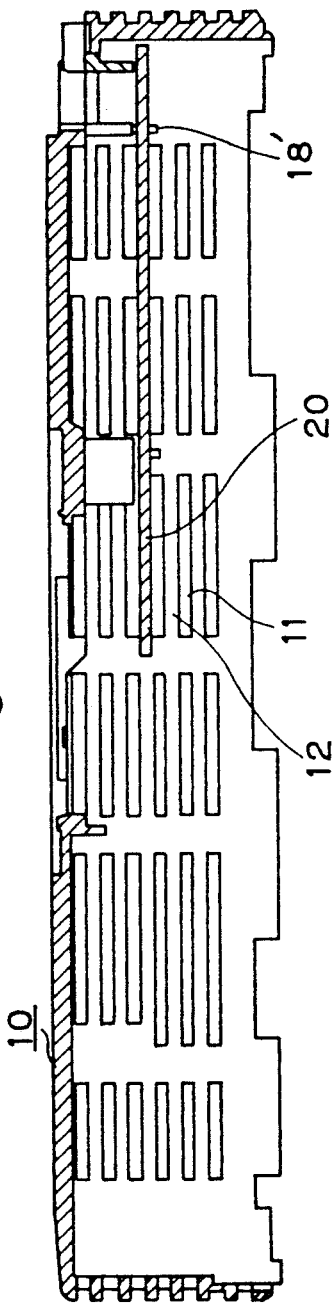
FIG. 5 is a view for explaining the convection cooling action.

FIG. 5 shows the cooling action due to free convection, wherein board 20 is mounted inside casing 10 such that it does not close the ventilating openings 11 or is in positional alignment with ribs 12. A holding portion 18' is provided to determine the attaching position of board 20 inside casing 10. That is, the height of the holding portion is selected so that printed board 20 coincides with ribs 12.

The embodiment advantageously provides ventilating openings 11 which function well as passages for free convection. Cooling is satisfactorily obtained through free convection. When forced convection is provided by use of fans, added cooling effect is attained.

Multiple functions of terminal mount

Figure 6:
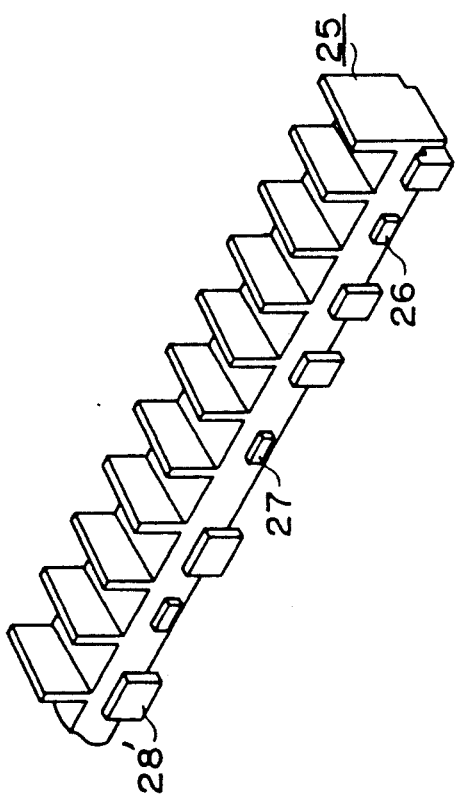
FIG. 6 is a perspective view depicting a portion of a terminal mount.

FIG. 6 shows a portion of terminal mount 25, wherein fixing portion 26 is in the form of a small protrusion provided on the side facing board 20 and is engageable with latch 61 of auxiliary frame 60. Pawl portion 27 is substantially identical to fixing portion 26 and is engageable with engaging portion 14 of casing 10. A flex limiting portion 28' is in the form of a protrusion larger than the pawl portion 27, and when coming into contact with board 20 causes terminal mount 25 to serve as a reinforcing member for board 20. Two terminal mounts 25 are provided in association with one board 20. By making all the terminal mounts identical and laterally symmetrical, the mounting of the mounts 25 relative to the individual edges of board 20 can be dealt with, thereby promoting standardization of parts.

Holding of auxiliary printed board

Figure 7:
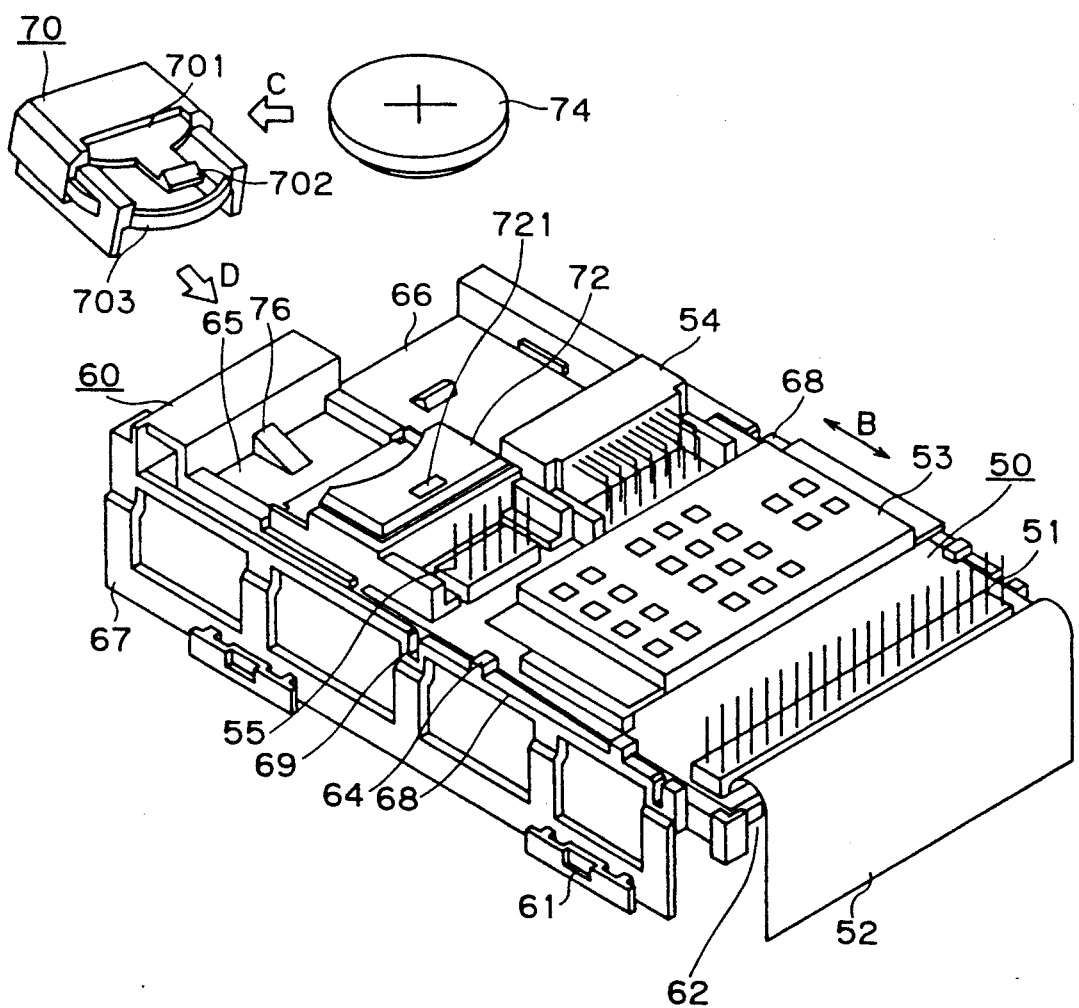
FIG. 7 is a prespective view depicting an auxiliary printed board with an auxiliary frame attached thereto.

FIG. 7 shows auxiliary board 50 and auxiliary frame 60 attached thereto, wherein auxiliary board 50 has a cable 52 for connection with main connector 51. Cable 52 is provided to establish communication with printed board 20 and auxiliary board 50. That is, various input and output signals are transmitted through terminal mount 25 between the main printed circuit board 20 and the auxiliary printed circuit board 50. (Incidently, the main board 20 is referred to only as the board 20, printed board 20 or printed circuit board 20, whereas the auxiliary printed circuit board 50 is always referred to as the auxiliary board 50, auxiliary printed board 50, or auxiliary printed circuit board 50) A ROM socket 54 is used to connect an ROM pack. By changing the ROM pack, the substance of signal processing performed by the auxiliary board 50 is altered as desired. A sub-connector 55 is used, for example, to receive power from battery 74.

A lock portion 64 is in the form of a pawl-like protrusion provided along an edge of auxiliary printed circuit board 50, and restricts the vertical movement of the auxiliary board 50. A battery chamber 65 is a space for placing battery 74, which is held in holder 70, and has a slope 76 provided opposite to battery storage portion 72. Slope 76 facilitates detaching of holder 70. A ROM chamber 66 has a flat face for receiving the ROM pack. Support legs 67 are provided to ensure a certain clearance between auxiliary board 50 and main board 20, and are spaced from one another to define gaps for air flow. A girder portion 68 is provided to support auxiliary printed board 50. That is, girder portion 68 supports auxiliary board 50 and shield plate 56. Notches 69 are formed in girder portions 68 at four points, and are engaged with positioning protrusions, not shown, of casing 10 to determine the position of display light section 53 and display cover 18 in the directions of arrow B.

Figure 8:
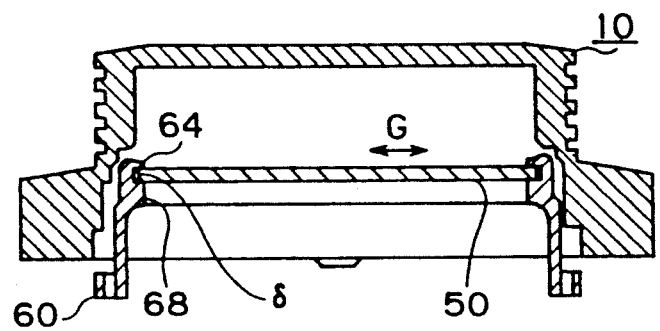
FIG. 8 is a sectional view depicting combined case and auxilliary frame.

FIG. 8 shows a combination of casing 10 and auxiliary frame 60. Since there is a gap δ between girder portion 68 and auxiliary board 50, the relative positioning of display light section 53 and display cover 18 is attained in the direction of arrows G. Gap δ absorbs manufacturing error and assemblying error so that manufacturing yield is increased.

Figure 9:
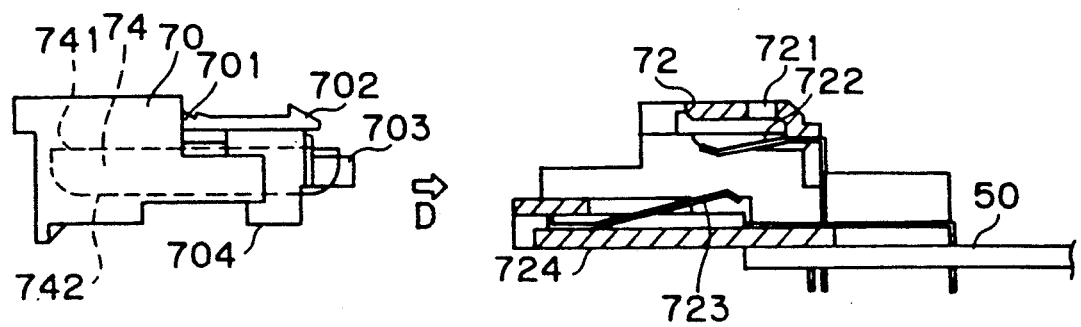
FIG. 9 is a side view used for explaining the stored state of the battery.

FIG. 9 shows battery 74 in a stored condition, wherein holder 70 has a touch portion 701 which is controlled when detaching holder 70 from battery storage portion 72, by a latch 702 acting to attach holder 70 to battery storage portion 72. A stopper face 703 is provided having a circular edge analogous to the shape of battery 74, and a contact face 704, formed with a notch on the bottom side. Battery storage portion 72 has an opening 721 engeable with latch 702, an upper contact element 722 coming into pressure contact with an upper electrode 741 of battery 74 held in holder 70. A lower contact element 723 comes into pressure contact with a lower electrode 742 of battery 74. A guide face 724 comes into contact with contact face 704.

Battery 74 is inserted into holder 70, as shown in FIG. 7, and holder 70 is moved in the direction of arrow D and latch 702 is engaged with opening 721 so as to secure holder 70. As a result, as shown in FIG. 9, contact elements 722 and 723 are kept in contact with electrodes 741 and 742, respectively, so that power from battery 74 si connected to auxiliary board 701. When detaching holder 70, touch portion 701 is depressed to disengage latch 702 from opening 721, so that the holder 70 is allowed to move in the direction opposite to arrow D. Once disengaged, battery 74 can be interchanged from holder 70.

Mounting of programmer

Figure 10:
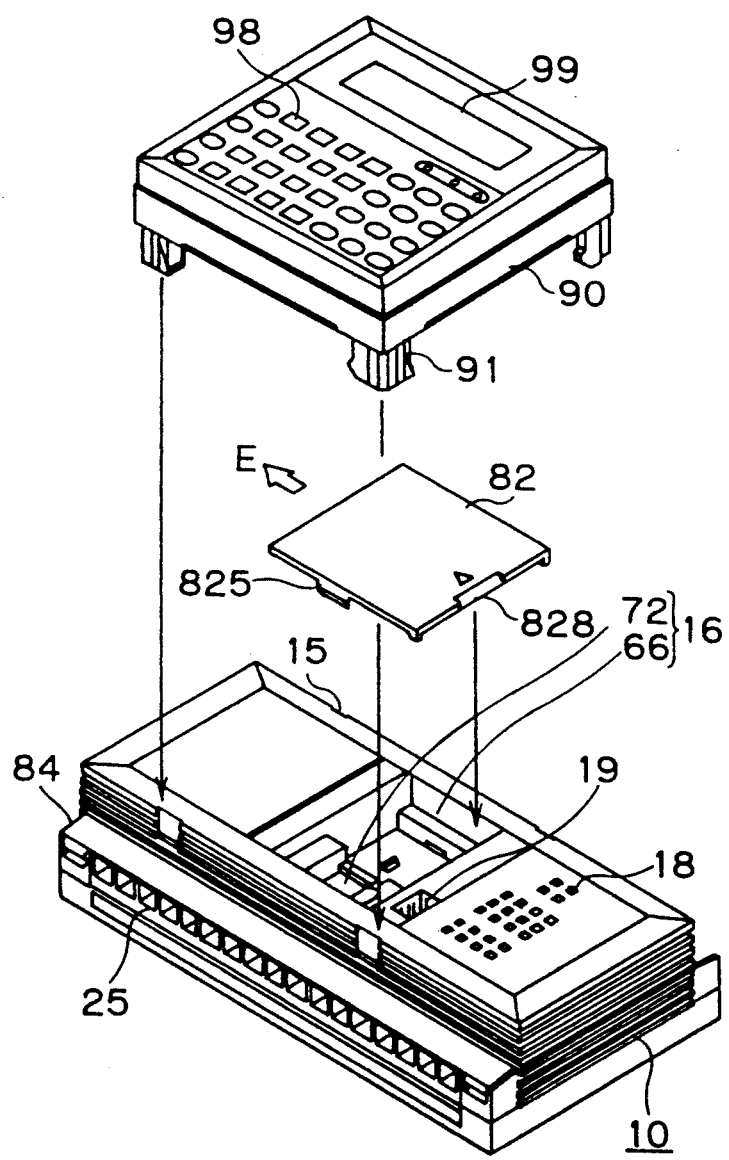
FIG. 10 is a perspective view depicting a programmer which can be mounted on the casing.

FIG. 10 shows the procedure for mounting programmer 90 onto casing 10. Casing 10 accommodates board 20, cushioning member 30, base 40, auxiliary board 50, auxiliary frame 60, etc. Cover 82 has a touch portion 828, formed along one edge thereof, which facilitates moving of cover 82, in the direction of arrow E. Lock portions 825 are formed along opposing edges of cover 82 and are orthogonal to the edge having touch portion 828. Provided on the surface of programmer 90 are key switches 98 for data entry and a display section 99 for display of the keyed data and of internal data held in casing 10. The display section 99 comprises, for example, liquid crystal displays or LEDs.

FIGS. 11(A) and 11(B) show programmer 90, wherein FIG. 11(A) is a bottom view, and FIG. 11(B) is a side view. FIG. 12 shows casing 10, on which programmer 90 is mounted. Programmer 90 can be mounted on casing 10 from either the horizontal direction H or the vertical direction V. An attaching leg 92 has latches 921 and 922 of high rigidity. On the other hand, attaching leg 93 has a displaceable latch 931 of low rigidity and a latch 932 of high rigidity. Latch 931 faces latch 921. A guide face 933, aligned with latch 932, acts as a guide when programmer 90 is attached to casing 10 in the horizontal direction. An attaching leg 94 has displaceable latches 941 and 942 of law rigidity. Latch 942 faces latch 932. A positioning protrusion 943, formed on a face parallel to latch 942, engages recess 15 when programmer 90 is attached to casing 10 in the horizontal direction, thereby determining the position of the programmer.

Similarly, a positioning protrusion 944, formed on a face parallel to latch 941, engages recess 15 when the programmer 9 is attached casing 10 in the vertical direction, thereby determining the position of programmer 90. An attaching leg 95 has a latch 951 of high rigidity which faces latch 941 and a latch 952 of low rigidity which faces latch 922. A guide face 953, aligned with latch 951, acts as a guide when programmer 90 is attached to casing 10 in the vertical direction. A connector 96 is provided between attaching legs 93 and 94, and when programmer 90 is attached in the horizontal direction, connector 96 is connected to sub-connector 55 through connector hole 19. A connector 97 is provided between attaching legs 92 and 93, and when programmer 90 is attached in the vertical direction, connects with sub-connector 55 through connector hole 19. Casing 10 has recesses 151 through 154 formed corresponding to attaching legs 92 through 95.

The procedure for attaching programmer 90 to casing 10 will now be described. Programmer 90 is square in shape with each side being 11 in length. The length of each side is set to be substantially equal to the maximum width 12 of casing 10 , exclusive of terminal mounts 25, so that programmer 90 does not project out from casing 10 irrespective of whether it is attached in the horizontal or vertical direction. Width 13 of casing 10, where programmer 90 is attached, is set to be substantially equal to the spacing between attaching legs 92 and 93 of programmer 90. Spacing 14 between recesses 151 and 152, or between recesses 153 and 154, is set to be substantially equal to the spacing between rigid latch 921 and displaceable latch 931. The outer spacing 15 and inner spacing 16 between recesses 151 and 154 of casing 10 are set by considering the size of the attaching legs 92 through 95 and the spacings therebetween. Since programmer 90 is prevented from displaying by guide faces 933 and 953 and positioning protrusions 943 and 944 of the attaching legs, no exessive force acts on the connection between connectors 96 and 97 and casing 10 even during attaching and detaching. Thus, reliability of the contact elements is greatly improved.

Covering

Figure 13:
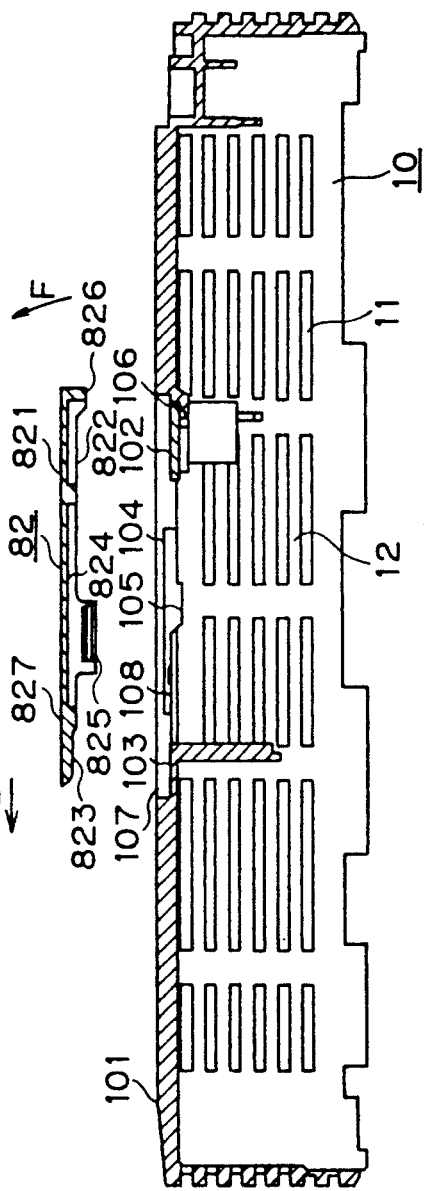
FIG. 13 is a view used for explaining the relationship between the casing and the cover.

FIG. 13 shows casing 10 with cover 82 separated therefrom, wherein cover 82 has a front face 821 aligned with the upper side when cover 82 is attached to opening 16 of casing 10, a contact face 822 which is a part of the back side close to one edge, a contact face 823 close to the other edge, and a central back face 824 defined between the two contact faces 822 and 823. A lock portion 825 includes a protrusion formed on the central back face 824, which secures cover 82 to casing 10. A protrusion portion 826 is provided at the end of contact face 822 to facilitate positioning. A stopper portion 827 is stepped and located between contact face 823 and lock portion 825.

Casing 10 has a flat face 101 around opening 16, which is substantially aligned with front face 821 when cover 82 is attached. A support face 102 contacts contact face 822, support face 103 contacts contact face 823, and lateral support face 104 contacts central back face 824, so that cover 82 is supported. A dented face 105 is engaged with lock portion 825 to prevent cover 82 from coming off casing 10. A recess 106 is engaged with protrusion portion 826 to prevent cover 82 from moving in the direction of arrow E and to thereby determine the position of the cover. A check portion 107 is provided at the end of support face 103, which contacts stopper portion 827 when cover 82 moves in the direction of arrow E so as to prevent further movement. This distance of movement is larger than the width of connector hole 19. Since a slide face 108 is provided between dented face 105 and support face 103, the bottom face of lock portion 825 slides on the slide face when it moves in the direction of arrow E.

The function of the embodiment will now be described. Where cover 82 is in a closed position, contact faces 822 and 823 and central back face 824 are in contact with support faces 102 and 103 and lateral support face 104, respectively. Since connector hole 19 is covered with central back face 824, programmer 90 cannot be mounted, battery 74 cannot be changed, and the ROM pack cannot be mounted. Also, lock portion 825 and dented face 105 are engaged, and protrusion portion 826 and recess 106 are fitted together.

When cover 82 is moved in the direction of arrow E, lock portion 825 is disengaged from dented face 105 to run onto slide face 108, and protrusion portion 826 is released from recess 106. Then, check portion 107 contacts stopper portion 827 so that further movement is prevented. Thus, connector hole 19 is exposed so that programmer 90 can be mounted on casing 10. Cover 82 serves as a cover for battery 74 and as a cover for the ROM pack. When cover 82 is moved in the direction of arrow F, lock portion 825 separates from slide face 108 thereby exposing the inside through opening 16.

Figure 14:
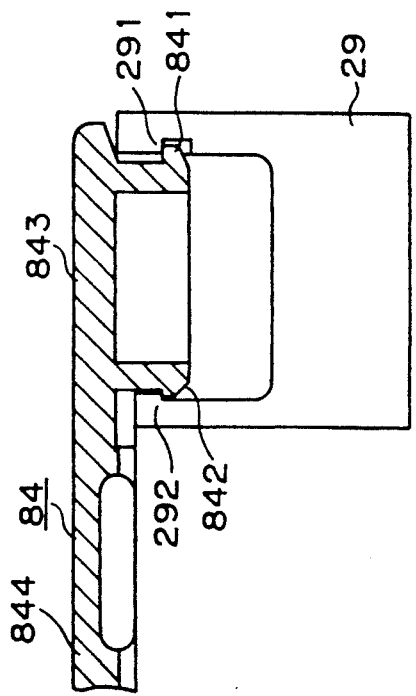
FIG. 14 is a fragmentary section view depicting a terminal mount cover.

FIG. 14 shows terminal mount cover 84. To secure terminal mount cover 84 to cover hold mount 29, terminal mount cover 82 has at its end an engaging portion 843, including a fixed protrusion portion 841 and a movable protrusion portion 842, whose length of projection is smaller than that of fixed protrusion portion 841. A plate portion 844 of terminal mount cover 84, for convering terminal mount 25, is made thin and has low rigidity. Cover hold mount 29 has a recess 291 which engages fixed protrusion portion 841 and a small protrusion portion 292 which engages movable protrusion portion 842.

When assembling the arrangement, engaging portion 843 is placed on cover hold mount 29, fixed protrusion portion 841 is inserted into recess 291, and force is applied from above cover 84 so that movable protrusion portion 842 engages small protrusion 292, and the two parts are latched together. When disassembling, the thin plate portion 844 is deformed in the thickness direction. Thus, some excessive force acts on the movable protrusion portion 842 so that the movable protrusion portion 842 is disengaged from small protrusion portion 292. As a result, force is concentrated on fixed protrusion portion 841, and thin plate portion 844, inclusive of engaging portion 843, undergoes blending deformation to become disengaged from recess 291 so that the terminal mount cover 84 is separated from cover hold mount 29.

Connecting of extended module

Figure 15:
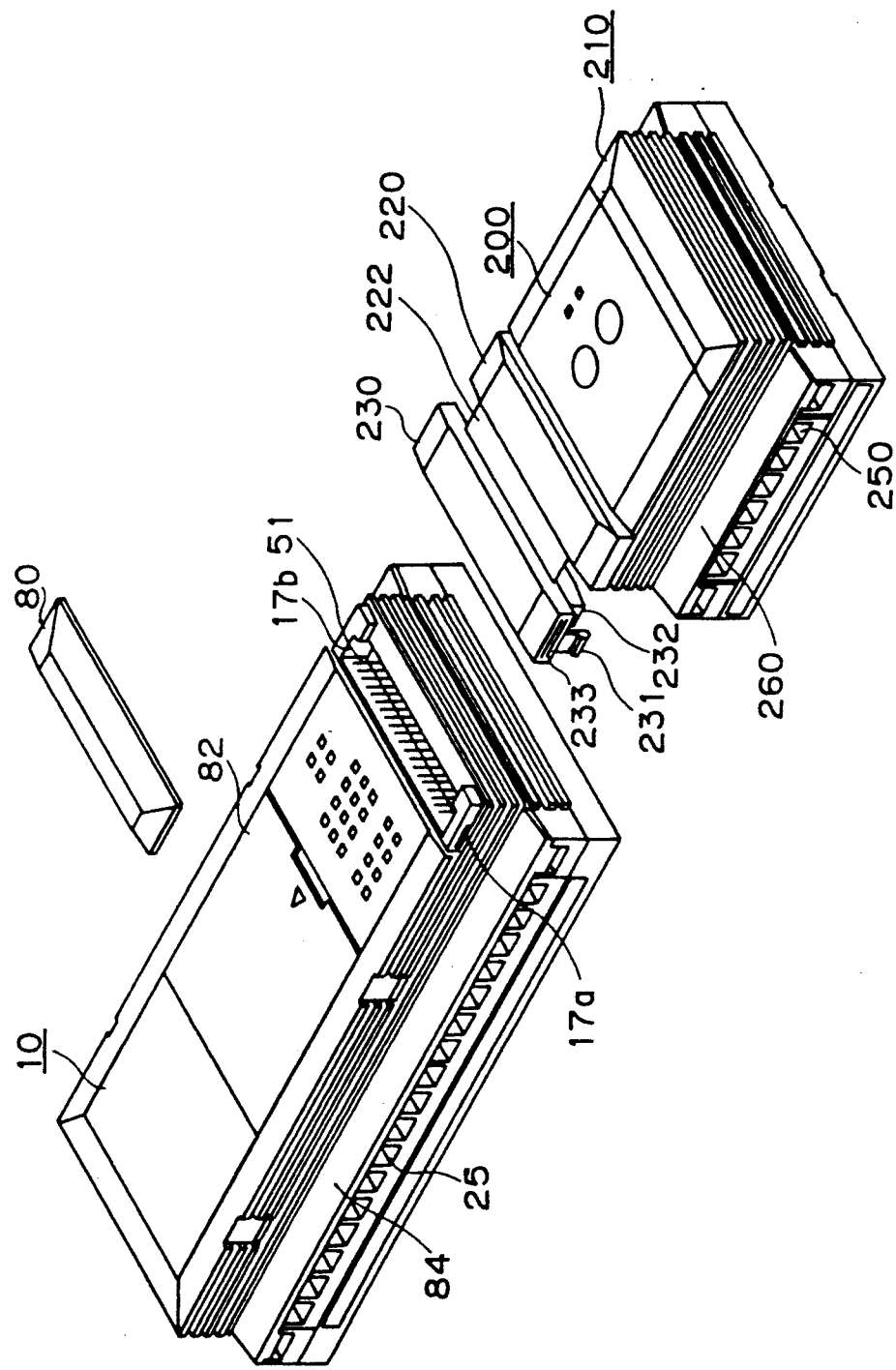
FIG. 15 is a perspective view depicting the casing and an extended module before connection.

FIG. 15 shows a procedure for connecting casing 10, i.e. the basic module, with an extended module 200. Extended module 200 is used, for example, where the functions of auxiliary board 50 in casing 10 are not sufficient for a desired purrpsoe. That is, the extended module 200 is used to incorporate other features. Since it is desirable that the cable arrangement be a short as possible, extended module 200 is attached in an adjacent relation. Extended module 200 has, along the opposing edges of its upper face, a connector cover 210 for connection with a succeeding module and a fixed side cable cover 220 for connection with a preceding module. Connector cover 210 is identical to cover 80 used for covering connector hole 17. A flat cable 222, comprising signal lead wires, is used to electrically connect extended module 200 with a basic module 10 or a preceding extended module, which is equipped with a fixed side cable cover 220 at one end and a movable side cable cover 230 at the other end. A terminal mount 250 is provided to connect the signal lead wires to extended module 200, which is shorter than terminal mount 25 for the basic module 10. A terminal mount cover 260 is provided to cover terminal mount 250.

FIGS. 16(A) and 16(B) show casing 10 connected to extended module 200, wherein FIG. 16(A) is a front view, and FIG. 16(B) is a schematic diagram depicting electrical connections between the printed circuit boards. A movable side cable cover 230, with a latch 231, is disposed in connector hole 17 in place of the connector cover 80. Thus, main connector 51 is connected with a joint connector 232. Fixed side cable cover 220 and movable side cable cover 230 are made laterally symmetrical, wherein individual height is set slightly higher than the top of casing 10 or extended module 200. This results in no appreciable unevenness of the surface of the modules after connection of the flat cable 22. Fixed side cable cover 220 covers an extended connector 221 connected to printed board 240, and movable side cable cover 230 covers joint connector 232 connected to main connector 51. The two connectors 221 and 232 are connected together by flat cable 222. An extended connector 242 is mounted on printed board 240 and covered with conenctor cover 210.

As shown, movable side cable cover 230 is provided in extended module 200 for connection with casing 10. That is, casing 10, exclusive of extended module 200, includes substantially no parts which are not needed. Thus, extended functions are attained without any added costs. Since flat cable 222 is covered with cable covers 220 and 230, it is well protected without any portion being exposed from the casing surface. Where another, e.g. succeeding, extended module 200a is to be connected in addition to the, e.g. preceding, extended module 200, connector cover 210 of the preceding extended module 200 is removed, and movable side cable cover 230 of the succeeding extended module 200a is attached. Accordingly, two modules can be readily electrically connected together through extended connector 242 and joint connector 232.

Assembling

Returning again toe FIG. 1, the procedure for assembling the embodiment involves the following steps. First, board 20, with the electronic component, terminal mounts 25, and the like, attached thereto, is attached using screws to base 40 together with cushioning member 30, insulating member 35 and frame 45. Then, auxiliary printed board 50 is mounted to auxiliary frame 60 together with shield plate 56. The resulting combination is attached to board 20, and cable 52 is connected as desired. Casing 10 is attached to cover board 20 with auxiliary board 50 mounted thereon, and all the covers are attached.

Where casing 10 is attached to DIN rail 100, guide latch member 110 and pressure latch member 120 are attached to base 40. As illustrated, programmer 90 can be mounted on casing 10, and battery 74 and the ROM pack can be changed after opening cover 82.

The foregoing stacked structure facilitates assembling of the embodiment.

The invention has the following advantages.

1. Since guide latch member 110 and pressure latch member 120 are detachable with respect to base 40 so that the casing assembly can be either attached to the DIN rail or a wall body, the invention is small in size.

2. Since heat generated in board 20 is transferred to the DIN rail or to the wall body, cooling effect is enhanced. Since boards 20 and 50 are aligned with ribs 12 so as to not close ventilating openings 11, the cooling effect based on free convection, is enhanced.

3. Since terminal mount 25 also serves as a structural member of board 20, the number of part is decreased and the amount of assembling work is decreased, as compared to the prior art.

4. Since auxiliary printed board 50 is attached to board 20 via auxiliary frame 60, the assembly work is relatively easy. Also, since auxiliary frame 60 is attached to terminal mounts 25, the arrangement of parts on board 20 is not limited.

5. Since the direction from which the programmer 90 can be attached to casing 510 can be selected as desired, assembly work effectiveness is improved. The degree of freedom as to direction is enhanced.

Also, since the positional relationship between programmer 90 and casing 10 is defined by the attaching legs, no excessive force acts on the connector. Accordingly, reliability of the assembly is improved.

6. Since cover 82 serves also as the covers for connector hole 19, battery 74, etc, several parts can be used in common. By merely sliding cover 82, the connector can be frequently put to use, and work effectiveness is enhanced.

7. Since extended module 200 is connected to casing 10 by merely using movable side cable cover 230, a modular system is effected which can be readily extended. Since another extended module can be connected to the first extended module, several extended modules can be readily connected to one basic module.

The foregoing description is illustrative of the principles of the invention. Numerous extensions and modifications thereof would be apparent to the worker skilled in the art. All such extensions and modifications are to be considered to be within the spirit and scope of the invention.

What is claimed is:

1. In a casing assembly including a printed circuit board on which an exothermic component is mounted, a casing covering said printed circuit board, and a base attaching said casing to a supporting member having a substantially U-shaped cross section and two flanges, said base having a first and a second attaching hole; the improvement comprising a guide latch member detachably mounted on said base and engaging one flange of said support member and comprising a pawl portion and a hook protrusion engaging said first attaching hole of said base; and a pressure latch member detachably mounted on said base and engaging the other flange of said support member and comprising a pawl portion, a hook protrusion engaging said second attaching hole of said base, a slider being slidable within at least a range corresponding to the width of said flange, a spring connected to said slider to apply urging force to cause said slider to be in resilient pressure contact with said support member, and a knob disposed on said slider to move said slider in opposition to said urging force of said spring, whereby the casing assembly is readily attached and detached from said support member.

2. In a casing assembly including a printed board on which an exothermic electronic component is mounted, a casing covering said printed circuit board, and a base attaching said casing to a support member; the improvement comprising said base being of a high heat conductive material and having a planar structure with a large contact area between said base and said support member;

a high heat conductive plate shaped cushioning member of an electrically insulative material and being interposed between said printed board and said base and in contact therewith, so that heat generated in said exothermic electronic component is released through said printed board, said cushioning member, and said base to said support member; and lead wires extending a short distance from said printed board toward said base; wherein said cushioning member is of flexible material and has a thickness larger than the extended length of said lead wires; and wherein said casing comprises a plurality of ribs arranged in lattice form to define a plurality of ventilating openings; and wherein said printed board is held inside said casing in alignment with said ribs so that heat generated in said printed board is cooled through free convection around said ventilating openings.

3. In a casing assembly including a printed board on which an exothermic electronic component is mounted, a casing covering said printed circuit board, and a base attaching said casing to a support member; the improvement comprising an auxiliary printed board interposed between said printed board and a flat surface of said casing;

an auxiliary frame held integrally with said auxiliary printed board so that said base, said printed board, said auxiliary frame and said auxiliary printed board are stacked together in that order and covered by said casing;

two terminal mounts attached to opposite edges of said printed board, said auxiliary frame being fixed to said terminal mounts;

two cover holder mounts provided at longitudinal ends of each terminal mount;

terminal mount covers attached at both ends to each cover holder mount, said terminal mount covers each comprising two engaging portions provided at the ends thereof which face said cover holder mounts, a fixed protrusion provided on the outer surface of said engaging portion, a movable protrusion provided on the inner surface of said engaging portion whose projection length is shorter than that of said fixed protrusion, and a thin plate portion of low rigidity covering said terminal mount; and wherein said cover holder mounts have a recess engaged with said fixed protrusion, and a short protrusion engaged with said movable protrusion, so that said terminal mount cover is attached to said cover holder mounts, said thin plate portion is flexed, said fixed protrusion is inserted into said recess, said engaging portion being depressed toward said cover holder mount, and said movable protrusion engages said short protrusion.

4. The assembly of claim 3, wherein said auxiliary printed board comprises a battery storage portion, and said casing comprises an opening, a connector hole, and a cover covering at least one of said opening and said connector hole.

5. In a casing assembly including a printed board, a casing covering said printed board, and a programmer attached to said casing and connected to said printed board, the improvement comprising:

said programmer being substantially square and comprising four attaching legs at substantially the four vertices thereof, and latches provided on the inner side surfaces of said attaching legs; and said casing comprising four recesses formed in the upper surface thereof corresponding to said four attaching legs so that said programmer is mounted on said casing by said attaching legs being engaged with said recesses; wherein said four attaching legs are substantially rectangular in cross section, with the inner side surfaces of each said attaching leg being in confronting relation to those of adjacent legs, wherein a first attaching leg has on its inner side surfaces two latches of high rigidity, a second attaching leg has on its inner side surfaces a displaceable latch of low rigidity and a latch of high rigidity, said displaceable latch being of low rigidity and facing said one latch of said first attaching leg, a third attaching leg has on its inner surfaces two displaceable latches of low rigidity, one of said displaceable latches facing said latch of high rigidity of said second attaching leg, a fourth attaching leg has on its inner side surfaces a displaceable latch of low rigidity and a latch of high rigidity, a displaceable latch of low rigidity facing the other latch of said first attaching leg and a latch of high rigidity facing said displaceable latch of low rigidity of said third attaching leg; and wherein said second attaching leg has a guide surface in alignment with its latch of high rigidity, said third attaching leg has a first positioning protrusion formed on a surface parallel to its one latch and a second positioning protrusion formed on a surface parallel to its other latch, and said fourth attaching leg has a guide surface in alignment with its latch of high rigidity, so that said programmer is attached to said casing in a horizontal position, and said guide surface of said second attaching leg acts as a guide and said first positioning protrusion engages said recess; so that said programmer is attached to said casing in a vertical position, and said guide surface of said fourth attaching leg acts as a guide and said second positioning protrusion engages said recess.

6. A casing assembly comprising
a basic electronic module (10) comprising
an upper surface having a first end portion;
a main connector (51) provided at a stepped portion below the upper surface of the basic electronic module and toward said first end portion; and
at least one extended electronic module (200) comprising
an extended connector 221;
a joint connector (232) connected to said main connector of said basic electronic module;
a flat cable (222) connected between said extended connector and said joint connector (232);
a fixed side cable cover (220) covering said extended connector, and having a surface in alignment with said upper surface of said basic electronic module; and
a movable side cable cover (230) covering said joint connector and having a surface in alignment with said upper surface of said basic electronic module, whereby the basic electronic module is connected to the at least one extended electronic module.

* * * * *